US009035815B1

United States Patent
Lowney et al.

(10) Patent No.: US 9,035,815 B1
(45) Date of Patent: May 19, 2015

(54) HIGH-SPEED AND HIGH-RESOLUTION SIGNAL ANALYSIS SYSTEM

(71) Applicant: Xilinx, Inc., San Jose, CA (US)

(72) Inventors: Donnacha Lowney, Dublin (IE); Aidan Keady, County Kildare (IE); Christophe Erdmann, Sandyford (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/197,003

(22) Filed: Mar. 4, 2014

(51) Int. Cl.
   *H03M 1/50* (2006.01)
(52) U.S. Cl.
   CPC .................................... *H03M 1/50* (2013.01)
(58) Field of Classification Search
   CPC .................................................... H03M 1/50
   USPC .................................................. 341/144, 166
   See application file for complete search history.

(56) References Cited

U.S. PATENT DOCUMENTS

| | | | |
|---|---|---|---|
| 7,106,239 B1 * | 9/2006 | Keskin | 341/157 |
| 7,907,076 B2 * | 3/2011 | Yoshida et al. | 341/158 |
| 8,471,751 B2 * | 6/2013 | Wang | 341/156 |
| 8,514,121 B1 * | 8/2013 | Shu | 341/155 |
| 8,554,514 B2 * | 10/2013 | Yamamoto et al. | 702/182 |
| 8,717,349 B2 * | 5/2014 | Tsai et al. | 345/213 |
| 8,823,575 B2 * | 9/2014 | Hagihara | 341/169 |
| 2014/0266848 A1 * | 9/2014 | Henzler et al. | 341/166 |

OTHER PUBLICATIONS

Rohde & Schwarz R&S FSW Signal and Spectrum Analyzer, Specifications, Test & Measurement, Data Sheet, 07.00, Version 07.00, Jun. 2013, pp. 1-32, Munich, Germany.

* cited by examiner

*Primary Examiner* — Peguy Jean Pierre
(74) *Attorney, Agent, or Firm* — W. Eric Webostad

(57) ABSTRACT

An apparatus relating generally to signal analysis is disclosed. In such an apparatus, a first comparator is coupled to receive a signal input and a first input level. A second comparator is coupled to receive the signal input and a second input level different from the first input level. A time-to-digital converter is coupled at a first port thereof, such as a start port for example, to receive a first output from the first comparator and coupled at a second port thereof, such as a stop port for example, to receive a second output from the second comparator. The time-to-digital converter is coupled to provide digital words representing the signal input.

19 Claims, 10 Drawing Sheets

US 9,035,815 B1

HIGH-SPEED AND HIGH-RESOLUTION SIGNAL ANALYSIS SYSTEM

FIELD OF THE INVENTION

The following description relates to integrated circuit devices ("ICs"). More particularly, the following description relates to a high-speed and high resolution signal analysis system for an IC.

BACKGROUND

For a high-performance data converter, such as a digital-to-analog converter ("DAC") (e.g., at least a 12-bit DAC for operation at least at 1.0 Giga-samples per second ("GS/s")), spectral purity of an output tone may be a consideration. Heretofore, a conventional high-performance spectrum analyzer was used to determine performance metrics of such a DAC, such as spurious free dynamic range ("SFDR"; i.e., a strength ratio of a fundamental signal to a strongest spurious signal in an output spectrum), among other performance metrics. For high-performance data converters, SFDR better than 80 dBc at low output tone frequencies and less than 60 dBc at high output tone frequencies (decibels relative to a carrier is a power ratio of a spurious signal to a carrier signal) may be obtained. This places challenging constraints on conventional signal analysis test equipment. Moreover, such test equipment conventionally may be expensive and bulky, as well as may be incompatible with a built-in self-test ("BIST").

Hence, it is desirable and useful to provide signal analysis which overcomes or mitigates one or more of the above-identified limitations associated with conventional signal analysis test equipment.

SUMMARY

An apparatus relates generally to signal analysis. In such an apparatus, a first comparator is coupled to receive a signal input and a first input level. A second comparator is coupled to receive the signal input and a second input level different from the first input level. A time-to-digital converter is coupled at a first port thereof to receive a first output from the first comparator and coupled at a second port thereof to receive a second output from the second comparator. The time-to-digital converter is coupled to provide digital words representing the signal input.

A method relates generally to signal analysis. In such a method, a signal input is received by each of a first comparator and a second comparator. A first input level is coupled to the first comparator. A second input level is coupled to the second comparator different from the first input level. A first output of the first comparator transitions responsive to the signal input at least reaching the first input level, and a time-to-digital converter is started in response to the first output associated with such transitioning. A second output of the second comparator transitions responsive to the signal input at least reaching the second input level, and the time-to-digital converter is stopped in response to the second output associated with such transitioning. A digital word representing a time interval for the signal input is output from the time-to-digital converter. The time interval at least approximates a transition from the first input level to the second input level of the signal input.

A system relates generally to signal analysis. In such a system, a first comparator is coupled to receive a signal input and a first input level. A second comparator is coupled to receive the signal input and a second input level different from the first input level. The signal input is obtainable from a device under test. A time-to-digital converter is coupled at a first port thereof to receive a first output from the first comparator and coupled at a second port thereof to receive a second output from the second comparator. The time-to-digital converter is coupled to provide digital words representing the signal input. A data processing sub-system is configured to store and process the digital words for the signal analysis.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

As devices get faster and smaller, having bulky and slow test equipment to characterize signals at a high-resolution becomes more problematic. However, as described below in additional detail, an in-system signal analysis platform may be used, where short channel devices are used to sample high-frequency signals at a high throughput or bandwidth while accuracy is provided with slower devices. Such accurate devices may be slow as compared to such short channel devices; however, multiple samples may be obtained at each of a multiplicity of levels, where such levels are accurately and incrementally provided by such slow but accurate devices to provide high-resolution. Along those lines for example, output of a device being tested may be processed for signal analysis, even though such output may be at a high frequency. Such high-frequency output may be processed to provide a high-resolution in either or both amplitude increments and/or time increments for signal analysis thereof. This may be used in place of expensive and bulky test equipment, and further may be used for real-time monitoring of a signal during operation.

With the above general understanding borne in mind, various configurations for signal analysis systems are generally described below.

Figure 1:
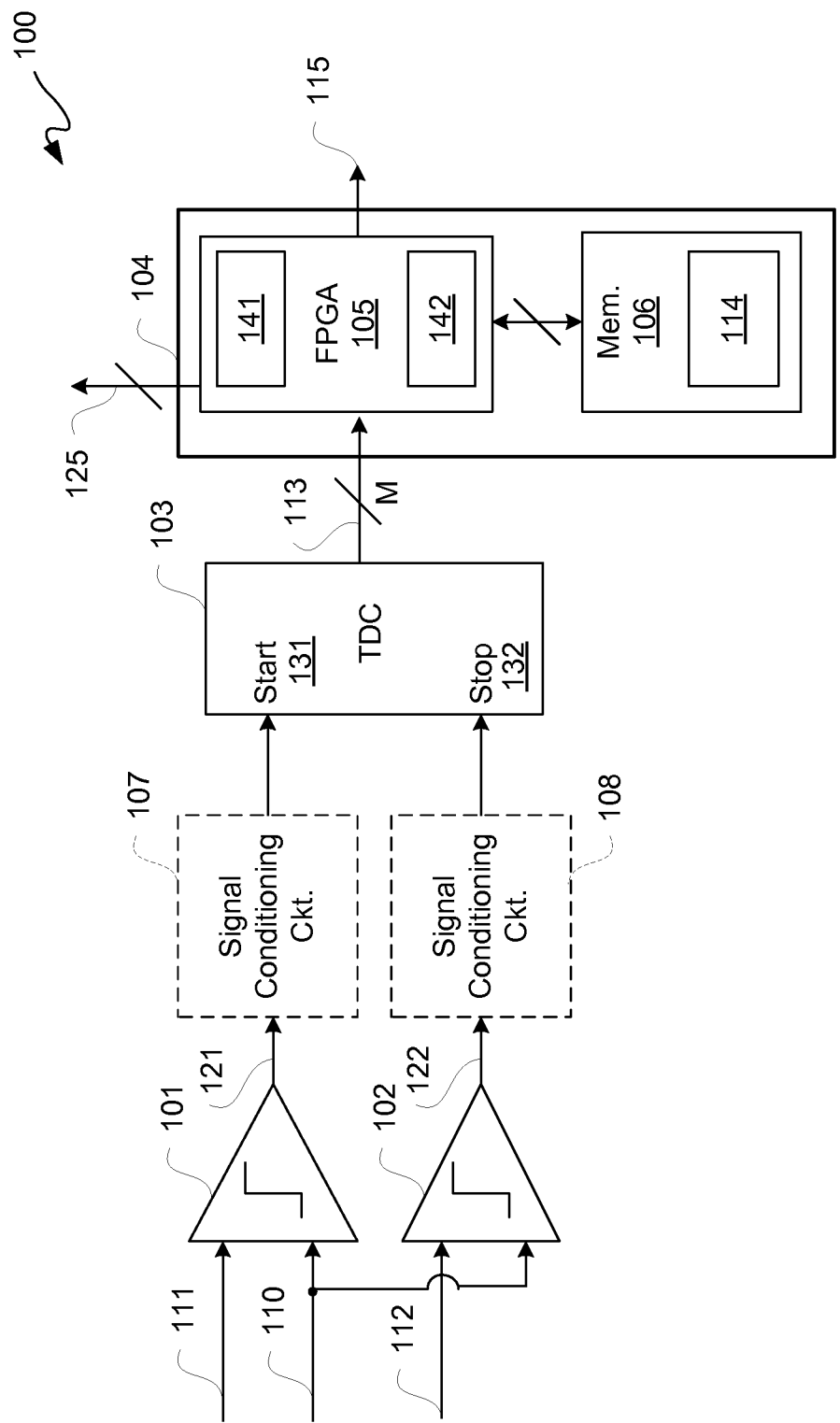
FIG. 1 is a block diagram depicting an exemplary signal analysis system.

FIG. 1 is a block diagram depicting an exemplary signal analysis system 100. Signal analysis system 100 includes a first comparator 101, a second comparator 102, a time-to-digital converter ("TDC") 103, and a data processing and storage die or dies ("data processing die") 104. In this example, data processing is performed by a programmed Field Programmable Gate Array ("FPGA") 105 coupled to receive M-bit data words ("words") 113 output from TDC 103. Such words 113 may be stored in random access memory ("RAM") or other memory 106 coupled to FPGA 105, where FPGA 105 provides an interface to such memory 106. However, in another configuration, a data processing die 104 may have sufficient on-chip memory so as to avoid having to use external memory 106. In another configuration, signal analysis system 100 may be provided as a single monolithic die. In yet another configuration, a data processing die 104 may include TDC 103. In still yet another configuration, comparators 101 and 102, as well as TDC 103 may be provided as a data converter die coupled to data processing die 104. Furthermore, multiple die may be coupled on an interposer or carrier to provide signal analysis system 100. For purposes of clarity by way of example and not limitation, it shall be assumed that data processing die 104 is provided as an FPGA 105 and external memory 106, where programmable resources of FPGA 105 are programmed to provide data processing in accordance with signal analysis as described herein, including without limitation spectral analysis. Along those lines, FPGA 105 may provide a high-resolution signal analysis output 115 generated using words 113, as described below in additional detail.

A first comparator 101 is coupled to receive a signal input 110 and a first input level ("reference level") 111. For purposes of clarity by way of example and not limitation, it shall be assumed that reference level 111 is a reference voltage level and that signal input 110 is an analog input waveform ("input waveform"). A second comparator 102 is coupled to receive input waveform 110 and a second input level ("data level") 112. For purposes of clarity by way of example and not limitation, it shall be assumed that data level 112 is a positive voltage data level. However, in other configurations data level 112 may be a negative voltage data level. Furthermore, it shall be assumed that even though reference level 111 and/or data level 112 may be fixed or adjusted ("swept"), reference level 111 is a static level and data level 112 is swept. Generally, there is some difference or separation between levels 111 and 112 for generating data samples corresponding to different sampling points.

Optionally, comparator output 121 of comparator 101 may be coupled to a control input start port 131 of TDC 103 through a signal conditioning circuit 107, and comparator output 122 of comparator 102 may be coupled to a control input stop port 132 of TDC 103 through a signal conditioning circuit 108. Even though separate start and stop ports are used in this example, other configurations may use a single port, such as an enable/disable port for example. Thus, even though for example first and second ports may be described herein, such ports may be a same port. Optional signal conditioning circuits 107 and 108 may, for example, be used to buffer outputs or output signals 121 and 122 for driving starting and stopping of TDC 103. However, for purposes of clarity and not limitation, it shall be assumed that outputs 121 and 122 are provided directly to start port 131 and stop port 132, respectively.

TDC 103 is coupled to provide digital words 113 representing input waveform 110 to data processing die 104. A storage device, such as memory 106 for example, may be coupled to FPGA 105 to store digital words 113.

Suppose for example a device under test is a digital-to-analog converter ("DAC"), and signal analysis system 100 is to synthesize a repetitive waveform for input waveform 110 output from such DAC. TDC 103 may be started and stopped with respect to a reference level 111 and a data level 112 of such waveform. By adjusting at least one of levels 111 and 112 and repetitively sampling input waveform 110, a digital representation of such input waveform may be obtained, such as may be stored as words 114 from words 113 in memory 106 generated from such repetitive sampling with sweeping or otherwise adjusting at least one reference level. In this example, FPGA 105 is programmed with a control module 141 and a data processing module 142. Control module 141 may be configured to generate at least one control adjustment or increment signal 125 to adjust at least one of levels 111 and 112. Data processing module 142 may be configured to perform a transform, such as for example a Fourier transform including without limitation a Fast Fourier Transform ("FFT"), a wavelet transform, and/or other known signal processing operations on such a digital representation. For example, a Fourier transform on a digital representation of a signal input may be used to identify a spur in such a signal input. An FFT and/or a special purpose filter may be used to identify a particular type of signal artifact, which may be for a data eye or a spur. Furthermore, data processing module 142 may include a processor, whether embedded or instantiated in programmable resources or a combination thereof, to perform statistical and other mathematical processing on such digital representation, including without limitation obtaining histograms or other distributions for repetitively sampling at set levels 111 and 112.

Signal analysis system 100 may be compatible with ultra-deep sub-micron ("UDSM") technology, where comparators 101 and 102 use UDSM short channel or gate transistors for fast switching times, namely for high bandwidth or throughput. However, amplitude resolution may be set by accuracy of an adjusted input level, such as described below in additional detail, and time resolution of TDC 103. Along those lines, sub-picosecond temporal resolution in excess of 18 bit amplitude resolution may be provided in an implementation of signal analysis system 100. A captured waveform may be further post-processed using spectral analysis techniques, and FPGA 105 may be programmed to carry out such spectral analysis. As such, signal analysis system 100 may provide on-die a combination of capabilities of a high-performance spectrum analyzer and an oscilloscope, such as a sampling oscilloscope for example. Furthermore, signal analysis system 100 may be used for built-in self-test ("BIST") applications for high performance DACs, serializer-deserializers ("SerDes") and input/outputs ("IOs").

Figure 2:
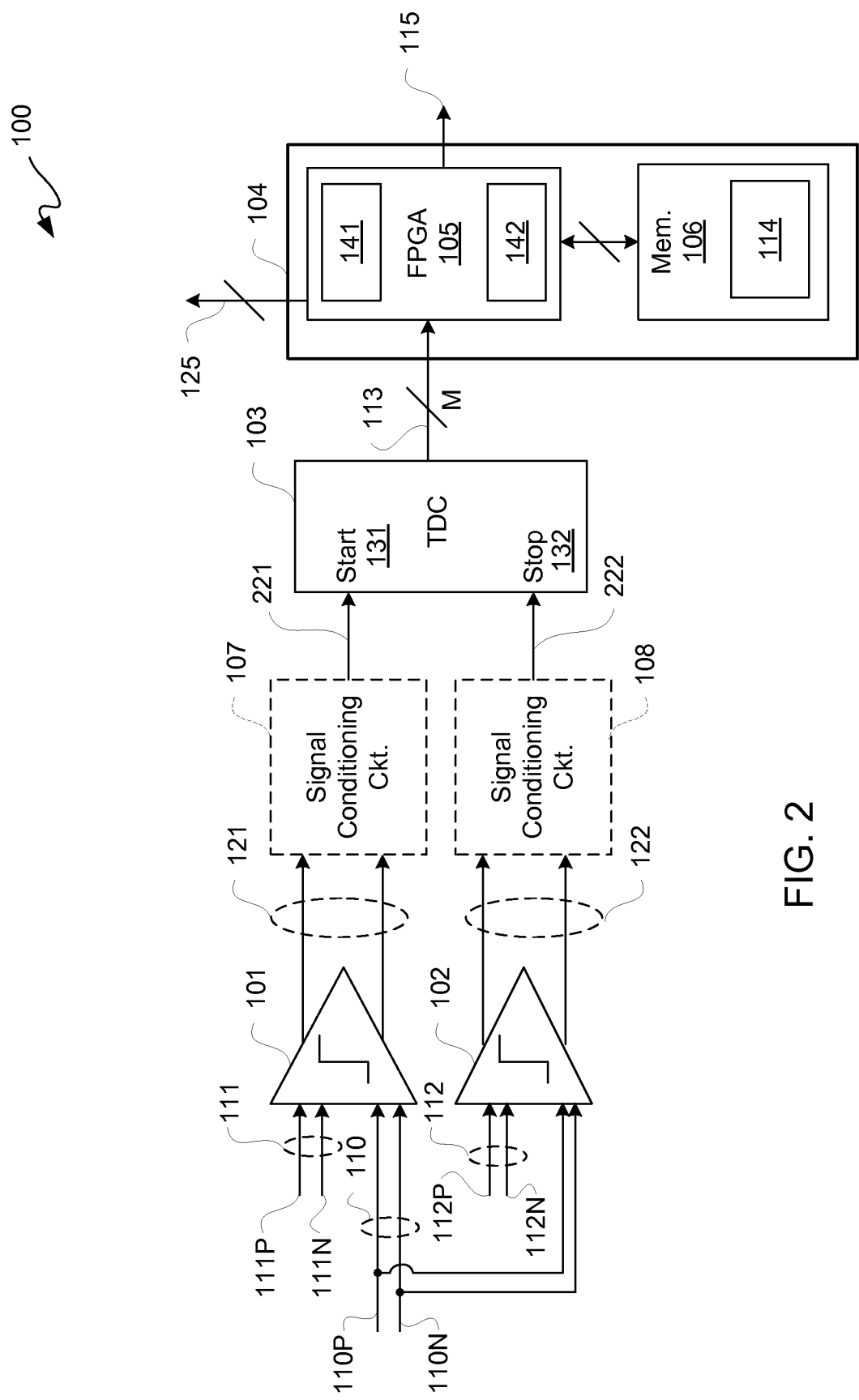
FIG. 2 is the block diagram of FIG. 1 for differential signaling.

FIG. 2 is the block diagram of FIG. 1, but for differential signaling. Where FIG. 1 generally depicts single-ended signaling for input waveform 110, levels 111 and 112, and comparator outputs 121 and 122, FIG. 2 generally depicts each of those signals as differential signals. Along those lines, input waveform 110 includes a positive rail or signal 110P and a negative rail or signal 110N; level 111 includes a positive rail or signal 111P and a negative rail or signal 111N; and level 112 includes a positive rail or signal 112P and a negative rail or signal 112N. Likewise, comparator outputs 121 and 122 respectively include a positive rail or signal and a negative rail or signal. Many high-speed applications use differential signaling, and comparators 101 and 102 may be configured for high-speed signaling applications. Along those lines, signal conditioning circuits 107 and 108 may optionally be configured to convert comparator outputs 121 and 122 to corresponding single-ended signals 221 and 222 to respectively drive input to start port 131 and stop port 132 of TDC 103.

In FIGS. 1 and 2, signal analysis system 100 may be used to generate a digital representation of a repetitive waveform or a repetitive glitch in a DC signal. For example, such a repetitive waveform may be generated by a DAC, a SerDes or an IO device, and a glitch in a DC signal may be generated by a power supply.

Figure 3:
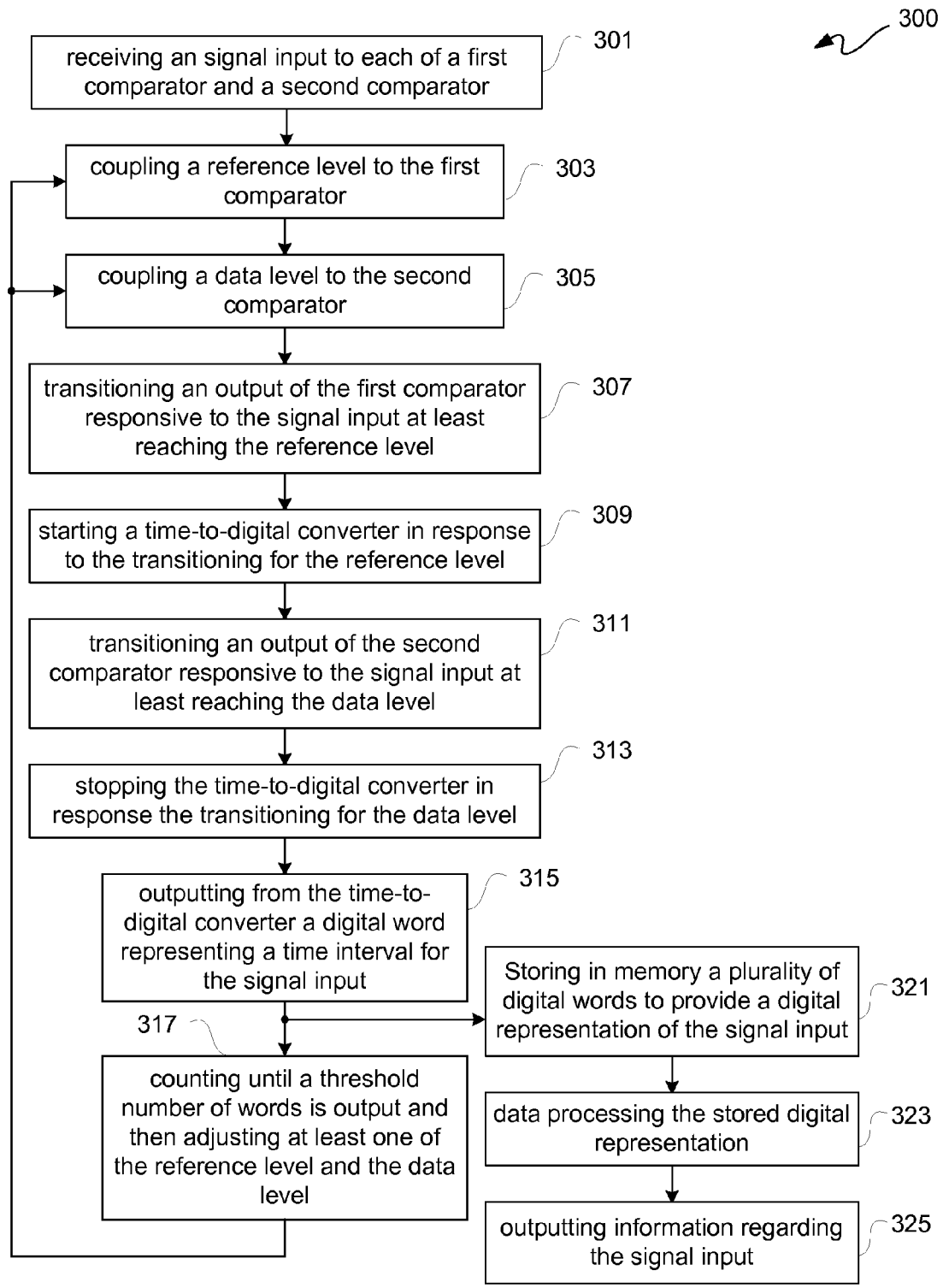
FIG. 3 is a flow diagram depicting an exemplary digital representation generation flow 300, such as may be used for the signal analysis systems of FIGS. 1 and 2.

FIG. 3 is a flow diagram depicting an exemplary digital representation generation flow 300, such as may be used for signal analysis system 100 of FIGS. 1 and 2. Accordingly, digital representation generation flow 300 is further described with simultaneous reference to FIGS. 1 through 3.

At 301, a signal input 110 may be received by each of comparators 101 and 102. At 303, a reference level 111 may be coupled to comparator 101. At or about the same time as the operation at 303, at 305 a data level 112 may be coupled to comparator 102.

At 307, a transitioning of an output of comparator 101 occurs responsive to signal input 110 at least reaching reference level 111. Such movement of signal input 110 may be in a positive or a negative direction, such as a positive voltage or negative voltage direction for example. Thus, by "at least reaching" it is generally meant attaining and/or surpassing a level in a direction associated with such level. Thus, for a positive level, "at least reaching" means going from below such positive level to at least equaling such positive level without having to preclude the possibility of surpassing such positive level, and, for a negative level, "at least reaching" means going from above such negative level to at least equaling such negative level without having to preclude the possibility of going lower than such negative level. At 309, a TDC 103 is started in response to such comparator 101 output transitioning in response to at least reaching reference level 111.

At 311, a transitioning of an output of comparator 102 occurs responsive to signal input 110 at least reaching input level 112. At 313, TDC 103 is stopped in response to such comparator 102 output transitioning in response to at least reaching data level 112.

At 315, TDC 103 may output a digital word representing a time interval for signal input 110. This time interval may at least approximate a transition from reference level 111 to data level 112 of such signal input 110. Multiple digital words may be obtained for set levels 111 and 112 in order to obtain a statistically significant sampling. Thus, operations 307 through 315 may be repeated to obtain multiple words for a reference level 111 and a data level 112 respectively coupled at 303 and 305. At 317, output words from 315 may be counted until a statistically sufficient number has been output for set levels 111 and 112, after which at least one of such levels 111 and/or 112 may be adjusted for sweeping to obtain other digital words for such one or more adjusted levels 111 and/or 112.

At 321, each word output from 315 may be stored in memory 106, and so a plurality of digital words 114 may provide a digital representation of signal input 110. At 323, such a digital representation may be data processed, such as previously described for example. At 325, information may be output, where such information is regarding such signal input 110 obtained from such data processing at 323.

Figure 4:
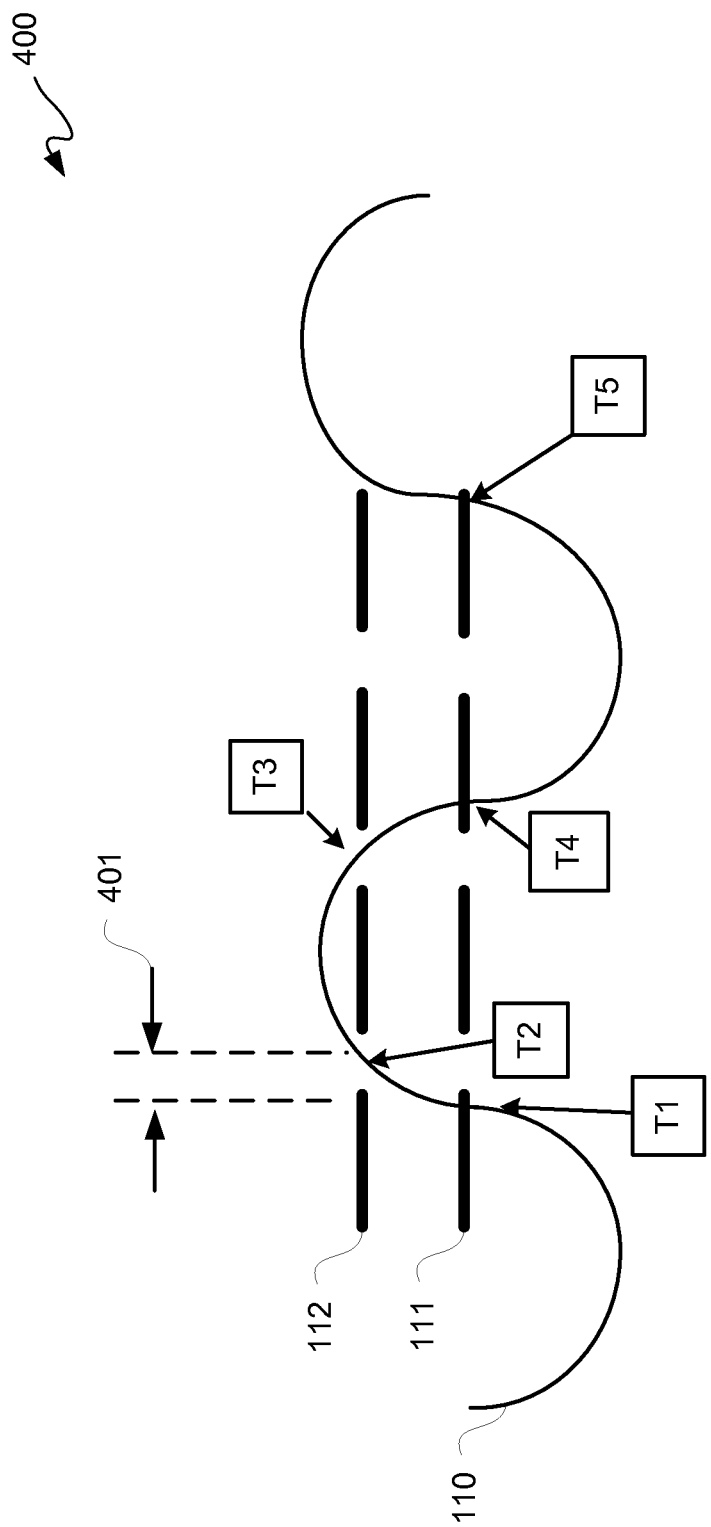
FIG. 4 is a graphical diagram depicting an exemplary sampling flow, which may be associated with some operations of the digital representation generation flow of FIG. 3.

To provide further understanding, FIG. 4 is a graphical diagram depicting an exemplary sampling flow 400, which may be associated with some operations of digital representation generation flow 300 of FIG. 3. Sampling flow 400 is further described with simultaneous reference to FIGS. 1 through 4.

Input waveform 110, which in this example is a sine wave, though other waveforms or signals may be used, is applied to input ports, such as at 301, of two wide bandwidth comparators 101 and 102. Generally, at time T1, amplitude of input waveform 110 exceeds a reference level 111, and so sampling by comparator 101 trips causing output thereof to transition from low to high starting TDC 103. TDC 103 increments its internal count until time T2, when input waveform 110 exceeds an inspection reference level or data level 112, causing sampling by comparator 102 to trip causing output thereof to transition from low to high. This transition of comparator 102 stops counting of TDC 103. Such internal count of TDC 103 represents an interval of time 401 from starting to stopping of TDC 103, which likewise represents an interval of time for input waveform 110 to go from reference level 111 to data level 112. This interval of time 401 may be output from TDC 103 as an M-bit word 113, and such M-bit word may be stored in memory 106. At times T3 and T4, comparators 102 and 101 respectively transition from high to low outputs, so TDC 103 is not triggered in this example for internal counting. However, at time T5, sampling is repeated, and so the above-described process begins again. Accordingly, a repetitive waveform may be reconstructed by such repetitive sampling.

In accordance with the above description, a set of TDC output codes may be built up that correspond to transition times of a signal input between reference level 111 and data level 112 crossings. Along those lines, a table of data level versus TDC code can be generated and sorted, such as by FPGA fabric 105, to yield a digital representation of signal input 110. Because of repetition in and/or of signal input 110, multiple samples may be taken with accurate, though comparatively slow, devices with respect to operating speeds of comparators 101 and 102. Sigma-Delta DACs may be slower for higher resolution. In other words, multiple samples with respect to reference levels generated from accurate but slow systems, such as Sigma-Delta DACs, may be taken with high-speed comparators 101 and 102.

Amplitude resolution may be set by accuracy of references for levels 111 and 112. These levels may be generated from low-speed, high-resolution Sigma-Delta DACs or other suitable accurate amplitude level generation devices. However, temporal resolution may be determined by accuracy of TDC 103, including a clock rate at which such TDC 103 is clocked by an internally generated clock signal thereof (not shown for purposes of clarity and not limitation). For example, 18-bit, low-speed Sigma-Delta DACs and TDCs with sub-picosecond resolution may be implemented in advanced CMOS processes. Comparators with small input switches may offer high bandwidth leveraging UDSM CMOS technology. Any offset in comparators 101 and 102 may lead to a constant offset in TDC code, and this offset may be calibrated out if desired.

High resolution in both in amplitude and time may be provided by signal analysis system 100, where such system has wide bandwidth sampling of repetitive waveforms or signals in a UDSM compatible architecture. Additionally, a digital representation of an analog waveform may be provided. Transient dynamics of a signal input, such as glitches in output of a high-performance DAC for example, may be record events. Additionally, with post data processing, such as using an FPGA or other resource, spectral information may be obtained.

Figure 5:
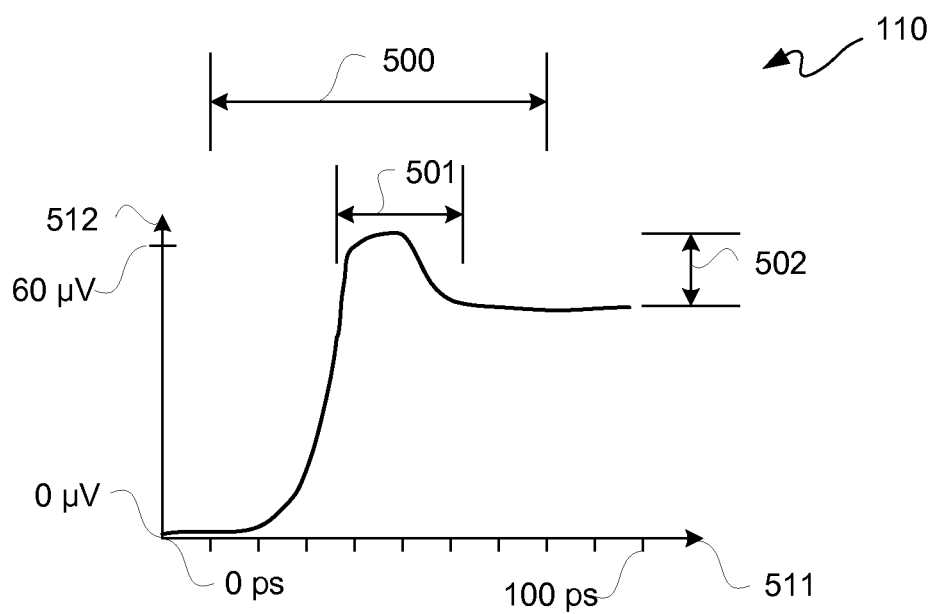
FIG. 5 is a signal diagram depicting an exemplary high-to-low signal transition of a signal input for the signal analysis systems of FIGS. 1 and 2.

Along those lines, FIG. 5 is a signal diagram depicting an exemplary low-to-high signal transition 500 of a signal input 110. Such signal transition 500 includes a glitch or spur or transient 501. In this example, such transition 500 occurs within the span of approximately 100 picoseconds ("ps") along a horizontal time axis 511. Furthermore, in this example such transition goes from approximately 0 micro-volts to an apex of approximately 60 micro-volts along a vertical voltage axis 512. Along those lines, a transient of less than approximately 30 ps with a transient swing 502 of less than approximately 20 micro-volts may be resolved by an implementation of signal analysis system 100. In this example, signal transition 500 is of a 14-bit high-performance DAC output having glitch energy represented by glitch 501; however, other signal transitions may have glitches for resolution by an implementation of signal analysis system 100.

Figure 6:
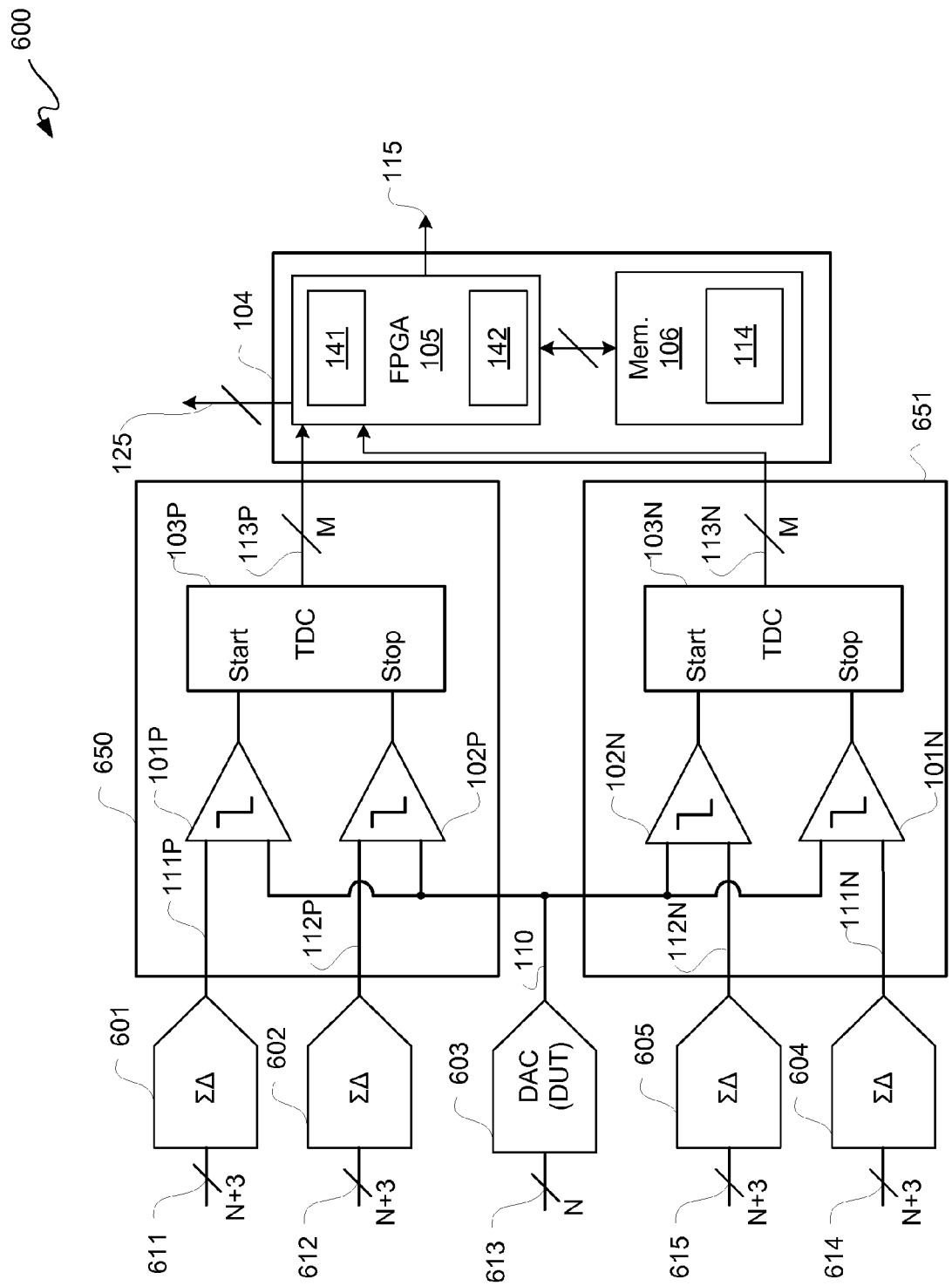
FIG. 6 is a block diagram depicting another signal analysis system, which includes two data acquisition portions, for operation in parallel though coupled to receive a common signal input.

FIG. 6 is a block diagram depicting a signal analysis system 600. Signal analysis system 600 generally includes two data acquisition portions, namely two instances of portions of signal analysis system 100, and these two data acquisition portions are operated in parallel though coupled to receive a common signal input 110.

In this example, same components of signal analysis system have same reference numbers with the addition of either a P for positive or an N for negative for comparators and TDCs, as well as associated signals. Along those lines, a positive data acquisition portion 650, which includes comparators 101P, 102P, and TDC 103P coupled as previously described, receives a positive reference level 111P, a positive data level 112P, and a signal input 110 to provide words 113P, where words 113P are to provide a digital representation of a positive voltage portion of signal input 110. Words 113P are provided as an input to FPGA 105, such as previously described.

Likewise, a negative data acquisition portion 651, which includes comparators 101N, 102N, and TDC 103N coupled as previously described, receives a negative reference level 111N, a negative data level 112N, and a signal input 110 to provide words 113N, where words 113N are to provide a digital representation of a negative voltage portion of signal input 110. Words 113N are provided as another input to FPGA 105, such as previously described.

Data acquisition sub-systems or portions 650 and 651 may be operated in parallel for processing a common signal input 110 between them. TDC 103P may be used to measure or determine positive level crossings of a D+ data level 112P of signal input 110 for a REF+ reference level 111P using TDC counts provided in words 113P. Likewise, TDC 103N may be used to measure or determine negative level crossings of a D− data level 112N of signal input 110 for a REF− reference level 111N using TDC counts provided in words 113N.

In this example, signal input 110 is an output of a high-performance N-bit DAC 603, which produces a repetitive waveform for signal input 110 in response to an N-bit digital input 613. In other examples, any other repetitive signal source may be used for signal input 110.

In this example, reference levels 111P and 111N are respectively generated by Sigma-Delta DACs 601 and 604. Reference levels 111P and 111N may be independently set by independently programming Sigma-Delta DACs 601 and 604. In this example, each of Sigma-Delta DACs 601 and 604 receive an (N+3)-bit digital input, namely digital inputs 611 and 614, respectively. Thus, in this example, each of Sigma-Delta DACs 601 and 604 may have 3 bits more resolution than a DAC 603 under test or other device under test ("DUT").

These three extra bits may provide up to 8 (i.e., $2^3$) amplitude quantization levels over a least significant bit ("LSB") transition. Such LSBs may be of DAC 603. This precision is somewhat arbitrary, and may be specified on an application-by-application basis. Thus, three, fewer than three, or more than three extra bits may be used for generating quantization levels. More than eight quantization levels may be used to provide higher resolution spectrum analysis. In some applications, not all N-bits input are used, but rather a subset, such as a set of most significant bits ("MSBs") are used, and in those applications quantization levels may be generated with N-bit or less than N-bit inputs to DACs 601 and 604. However, for purposes of clarity by way of example and not limitation, it shall be assumed that eight quantization levels are generated.

In this example, data levels 112P and 112N are respectively generated by Sigma-Delta DACs 602 and 605. Data levels may, though need not be, opposites of one another. Data levels 112P and 112N may be independently set by independently programming Sigma-Delta DACs 602 and 605. In this example, each of Sigma-Delta DACs 602 and 605 receive an (N+3)-bit digital input, namely digital inputs 612 and 615, respectively. Thus, in this example, each of Sigma-Delta DACs 602 and 605 may have 3 bits more resolution than a DAC 603 under test or other DUT.

For purposes of clarity, it shall be assumed that both data and reference level DACs all have the same input bit widths for generating same numbers of quantization levels for positive and negative portions of a signal input 110. However, in other configurations, the number of quantization levels for positive and negative portions of a signal input 110 may be different. Thus, digital input 611 bit width may be any of equal to, greater than, or less than bit width of digital input 614. Likewise, digital input 612 bit width may be any of equal to, greater than, or less than bit width of digital input 615. However, generally, input bit widths of digital inputs 611 and 612 may be equivalent in number, and input bit widths of digital inputs 614 and 615 may likewise be equivalent in number.

For purposes of clarity by way of example and not limitation, suppose a 16-bit DAC operating at high-speed (i.e., greater than 1.5 GS/s) is DAC 603, reference levels may be readily produced by low-speed (i.e., less than 1 GS/s) 19-bit Sigma-Delta DACs 601, 602, 603, and 604 for signal analysis of a repetitive waveform output from DAC 603. An update rate of code (i.e., change in amplitude) of Sigma-Delta DACs is slow in comparison to frequency of a signal output from DAC 603, such as a sine wave having a frequency at or in excess of a Giga-hertz ("GHz"). So though a reference level and/or a data level may be changed slowly, such as for sweeping, this changing may be at slower rate due to repetition of a waveform output from a DUT, because many samples may be taken at each set of reference level settings. Through statistical data processing of such samples, such as for example determining an average, throwing out excessively high and low samples, generating data histograms, and/or other statistical data processing, a high-resolution digital representation of a signal may be generated for signal analysis, including without limitation spectral analysis. Effectively, high-frequency analog signals may be characterized using high-speed (short gate) comparators with slow changing of input levels by having multiple samples and a repetitive waveform. Along those lines, a sufficiently complete resolution ("complete picture") for a digital representation may be generated with a sufficient number of samples at each set of input levels with sweeping of D+ and D− data levels for example. In short, accuracy may be obtained with Sigma-Delta DACs and bandwidth may be obtained with short-channel transistor comparators.

Along the above lines, high bandwidth repetitive analog signals may be measured using circuits compatible with UDSM CMOS processes, where such signals may be measured with greater than 18-bit amplitude and less than 1 ps temporal resolution. In other configurations, Sigma-Delta DAC references may be replaced with any other high precision adjustable reference. Furthermore, though a DAC is described as a DUT, such DUT may be replaced with any repetitive signal source. Along those lines, SerDes data eye openings may be measured for example.

As described, instantiation of TDCs and Sigma-Delta DACs may be in an ASIC along with an FPGA, or such TDC may be instantiated in FPGA fabric, or Sigma Delta DAC cores could be instantiated in FPGA fabric but filters therefor may be in an ASIC, or some other combination hereof. In another configuration, IO devices may be used as comparators in a low-end implementation, with a DUT output looped back through a PCB to an IO comparator. Programming information, such as a configuration bitstream for FPGA, may be used to control sweeping and post processing of data, and programmable resources programmed may be overwritten following a BIST process. Over-writing a programmed configuration bitstream may be particularly useful to protect from reverse engineering if TDC and Sigma-Delta DAC cores are instantiated in FPGA fabric. For FPGAs or other SoCs that have arrays of DACs, DACs other than a unit under test, may be multiplexed to provide input levels to further protect against reverse engineering.

Figure 7:
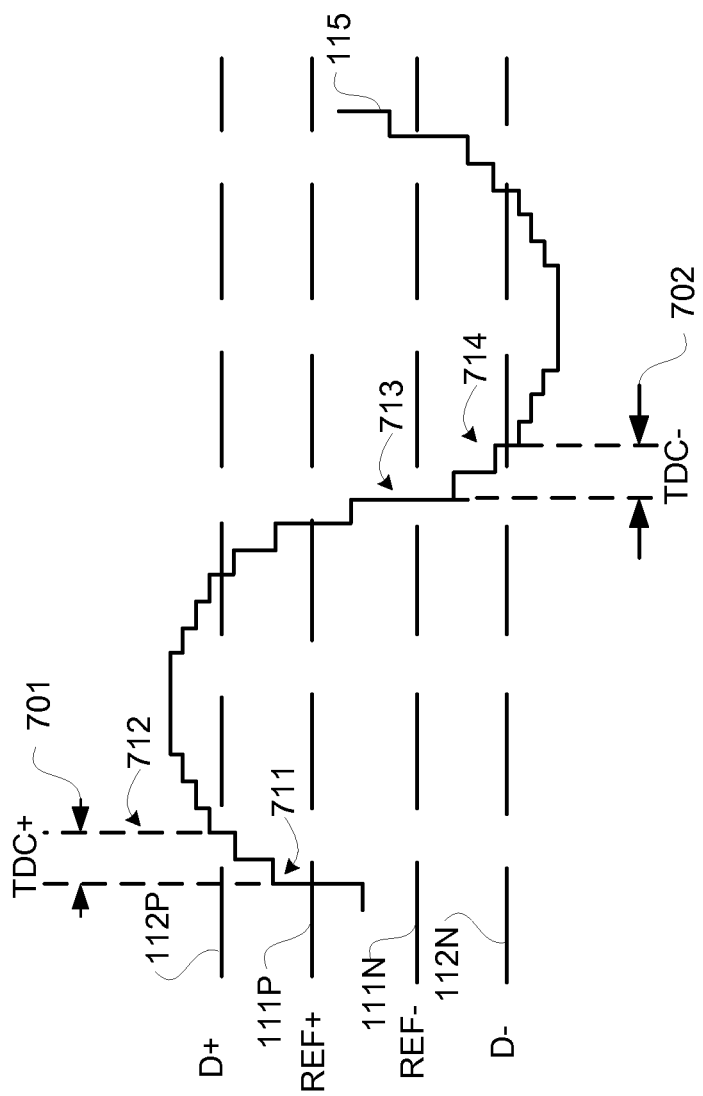
FIG. 7 is a signal diagram depicting an exemplary high-resolution digital representation of a sine wave signal input after processing with the signal analysis system of FIG. 6.
Figure 8:
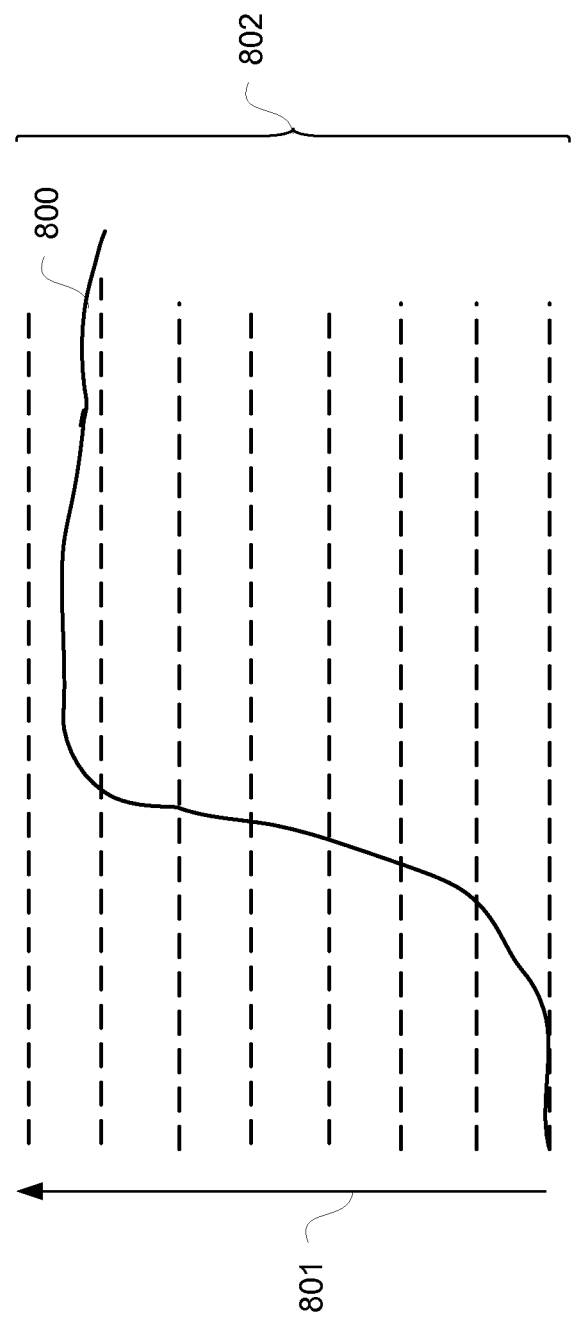
FIG. 8 is a signal diagram depicting an exemplary sweeping of a data level for signal processing by the signal analysis system of FIG. 6.

FIG. 7 is a signal diagram depicting an exemplary high-resolution digital representation of a sine wave signal input, for a signal input 110, after processing with TDCs 103P and 103N of signal analysis system 600 of FIG. 6. FIG. 8 is a signal diagram depicting an exemplary sweeping of a data level, such as data level 112P for example, for signal processing by signal analysis system 600 of FIG. 6. With simultaneous reference to FIGS. 6 through 8, FIGS. 7 and 8 are further described.

High-resolution signal analysis output 115 is a digital representation of an analog signal input 110, where each reference D, namely data levels 112P and 112N, may be adjusted over multiple levels 802 to stop corresponding TDCs, namely TDCs 103P and 103N, at a different points in time. In this example, there are eight levels 802; however, in other configurations fewer or more than eight levels may be used. Furthermore, in this example, adjusting of a data level goes from low to high, as generally indicated by arrow 801, however, in other examples data level may be swept from high to low.

For purposes of clarity by way of example and not limitation, suppose data level 112P is slowly swept relative to acquisition rate of signal analysis system 100, then multiple samples may be taken at each of levels 802 for a data level transition 800. In this example, at approximately time 711, a reference level 111P may be crossed by a signal input 110 to start a TDC 103P counting, and at approximately time 712, a data level 112P may be crossed by such a signal input 110 to stop TDC 103P's counting, which effectively may register a TDC interval 701 for a positive transition interval or portion of data of such a signal input. In this example, at approximately time 713, a reference level 111N may be crossed by such a signal input 110 to start a TDC 103N counting, and at approximately time 714, a data level 112N may be crossed by such a signal input 110 to stop TDC 103N's counting, which effectively may register TDC interval 702 for a negative transition interval or portion of data on such a signal input.

For this example, a DAC DUT may have an edge transition from one code to the next which may occur over approximately 100 ps. Each of such TDCs may have approximately a 1 to 10 ps resolution for such an application. For example for a 100 MHz output tone for signal input 110, approximately 1 k to 10 k samples per period may be taken. For a 16-bit TDC output code or code word, on-chip memory in an FPGA 105 may be exclusively used for such storage to avoid having to implement memory 106 for such storage. If, however, a larger data set is used, for example such as by using coherently excited tones for signal input 110, off-chip storage in high-speed memory 106 may be used. As data is acquired, it may be effectively stored in a memory stack in internal FPGA memory or external memory coupled to an FPGA. Each element of such a memory stack may include a reference code and a TDC value, which effectively may be amplitude versus time data sets. To generate more familiar time versus amplitude data sets, an insertion sort algorithm or other sorting algorithm can be applied for stack reordering of TDC codes in sequence.

Scan acquisition time may be limited by filter bandwidth in Sigma-Delta DACs 601, 602, 604, and/or 605. For example, an update rate of approximately 10 microseconds per code may be used for a scan on approximately a 100 MHz tone with approximately a 10 picosecond resolution, and such scan time may take approximately 10 milliseconds. If averaging is used, then scan time may grow linearly with the number of data sets used for such averaging. This is just one example for purposes of clarity by way of example, and various other configurations and values associated therewith may be used.

Figure 9:
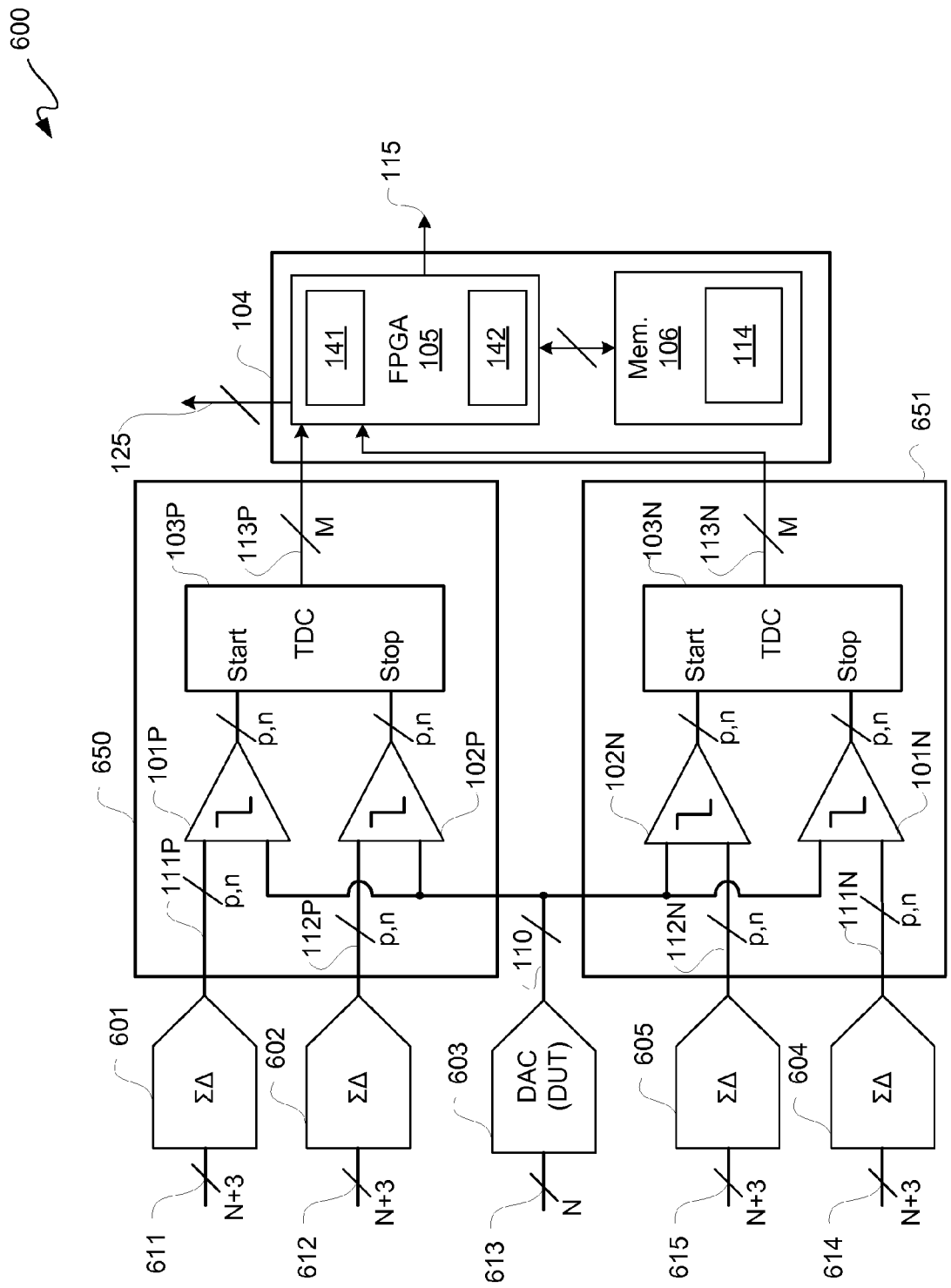
FIG. 9 is the block diagram of FIG. 6, though for differential signaling.

FIG. 9 is the block diagram of FIG. 6, though for differential signaling. In this example, TDCs 103P and 103N are configured to receive differential inputs at start and stop ports respectively thereof. Accordingly, comparators 101P and 102P, as well as comparators 101N and 102N, are respective sets of differential comparators. Additionally, DUT DAC 603, as well as DACs 601, 602, 604, and 605, are respective differential DACs. Even though processing of differential signaling is described, it should be understood that each rail of a differential signal may be individually analyzed by treating each rail as a single-ended signal, as described elsewhere herein. Again, signal input is not limited to an analog signal or a sine wave, as any repetitive signal or signal with a repetition may be used. For example, a clock signal, single-ended or differential, may be used for signal input 110. Furthermore, a power supply or other DC voltage with a reoccurring glitch may be used for signal input 110.

Additionally, signal input 110 need not be a repetitive signal or a signal with a repetitive event, as by taking multiple samples for TDC outputs, a maximum and/or minimum amplitude, such as of a glitch or spur, may be determined for parameter, in contrast to waveform, determination. Along those lines, time between events or zero crossing may be determined in order to measure duty cycle and/or jitter in a signal. Such determination of a glitch or jitter may be used to set a threshold, where if such threshold is exceeded, an alarm may be initiated indicating a degradation in advance of a failure. Furthermore, such an alarm may be initiated to indicate that tampering may have been detected. As an FPGA may be coupled for remote monitoring, signal status may be remotely monitored.

Accordingly, high-resolution signal analysis may be performed, such as by a programmed FPGA, as described herein. Such signal analysis may include high-resolution spectral analysis. Effectively, an FPGA may be programmed to provide a high-resolution spectral analyzer, and thus may be coupled to a monitor or other display device (not shown) for such purpose. Furthermore, in an implementation, a system may be controlled from an FPGA for post processing data (e.g., generate FFTs and other signal analysis) to determine performance metrics, such as data converter linearity (SFDR) and/or SerDes bit error rates (i.e., eye openings), among other forms of data processing. This ability to synthesize an entire architecture within FPGA fabric, and possibly with a few external filtering components on a PCB and/or interposer as described herein, may be used in BIST of data converters coupled to FPGA fabric, including is Stacked Silicon Interposer Technology ("SSIT") among other forms of stacked dies.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 10:
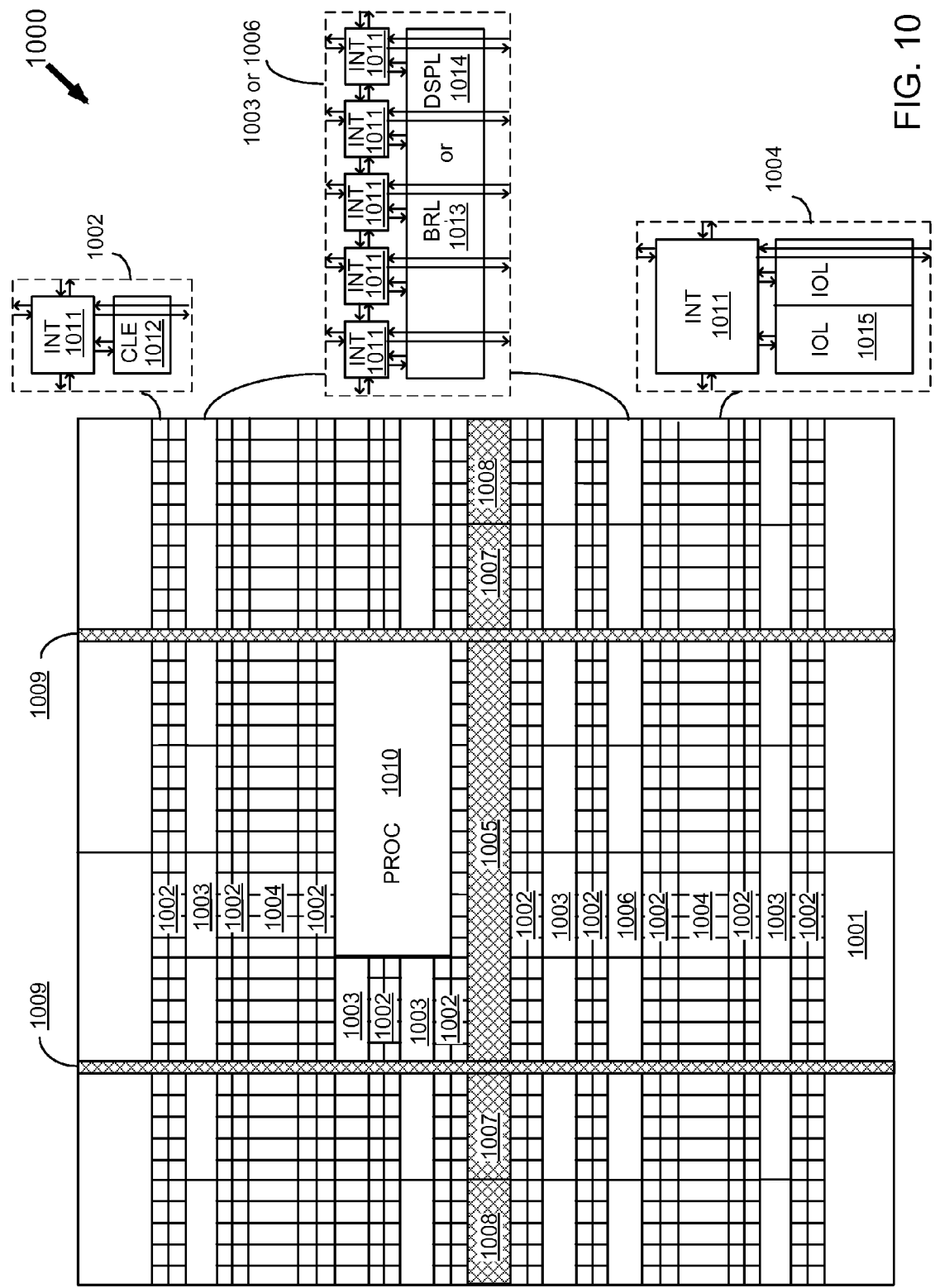
FIG. 10 is a simplified block diagram depicting an exemplary columnar Field Programmable Gate Array ("FPGA") architecture.

As noted above, advanced FPGAs can include several different types of programmable logic blocks in the array. For example, FIG. 10 illustrates an FPGA architecture 1000 that includes a large number of different programmable tiles including multi-gigabit transceivers ("MGTs") 1001, configurable logic blocks ("CLBs") 1002, random access memory blocks ("BRAMs") 1003, input/output blocks ("IOBs") 1004, configuration and clocking logic ("CONFIG/CLOCKS") 1005, digital signal processing blocks ("DSPs") 1006, specialized input/output blocks ("I/O") 1007 (e.g., configuration ports and clock ports), and other programmable logic 1008 such as digital clock managers, analog-to-digital converters, system monitoring logic, and so forth. Some FPGAs also include dedicated processor blocks ("PROC") 1010.

In some FPGAs, each programmable tile includes a programmable interconnect element ("INT") 1011 having standardized connections to and from a corresponding interconnect element in each adjacent tile. Therefore, the programmable interconnect elements taken together implement the programmable interconnect structure for the illustrated FPGA. The programmable interconnect element 1011 also includes the connections to and from the programmable logic element within the same tile, as shown by the examples included at the top of FIG. 10.

For example, a CLB 1002 can include a configurable logic element ("CLE") 1012 that can be programmed to implement user logic plus a single programmable interconnect element ("INT") 1011. A BRAM 1003 can include a BRAM logic element ("BRL") 1013 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 1006 can include a DSP logic element ("DSPL") 1014 in addition to an appropriate number of programmable interconnect elements. An IOB 1004 can include, for example, two instances of an input/output logic element ("IOL") 1015 in addition to one instance of the programmable interconnect element 1011. As will be clear to those of skill in the art, the actual I/O pads connected, for example, to the I/O logic element 1015 typically are not confined to the area of the input/output logic element 1015.

In the pictured embodiment, a horizontal area near the center of the die (shown in FIG. 10) is used for configuration, clock, and other control logic. Vertical columns 1009 extending from this horizontal area or column are used to distribute the clocks and configuration signals across the breadth of the FPGA.

Some FPGAs utilizing the architecture illustrated in FIG. 10 include additional logic blocks that disrupt the regular columnar structure making up a large part of the FPGA. The additional logic blocks can be programmable blocks and/or dedicated logic. For example, processor block 1010 spans several columns of CLBs and BRAMs.

Note that FIG. 10 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 10 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
    a first comparator coupled to receive a signal input and a first input level;
    a second comparator coupled to receive the signal input and a second input level different from the first input level;
    a time-to-digital converter coupled at a first port thereof to receive a first output from the first comparator and coupled at a second port thereof to receive a second output from the second comparator;
    wherein the time-to-digital converter is coupled to provide digital words representing the signal input;
    wherein one of the first input level and the second input level is adjustable and another of the first input level and the second input level is fixed for sampling the signal input;
    wherein the first input level is a reference voltage level; and
    wherein the second input level is a data voltage level.

2. The apparatus according to claim 1, further comprising:
    a first signal source coupled to receive a first digital input to provide the first input level to the first comparator;
    a second signal source coupled to receive a second digital input to provide the second input level to the second comparator; and
    a third signal source coupled to receive a third digital input to provide the signal input to the first comparator and the second comparator.

3. The apparatus according to claim 2, wherein:
    the first port is a start port;
    the second port is a stop port;
    the first signal source is first digital-to-analog converter ("DAC");
    the second signal source is a second DAC;
    the third signal source is a third DAC; and
    the first DAC and the second DAC are respective Sigma-Delta digital-to-analog converters.

4. The apparatus according to claim 2, wherein bit-width of the first digital input is equal to bit-width of the second digital input.

5. The apparatus according to claim 4, wherein the bit-width of the first digital input is equal to bit-width of the third digital input.

6. The apparatus according to claim 4, wherein the bit-width of the first digital input is greater than bit-width of the third digital input.

7. The apparatus according to claim 2, wherein:
    the time-to-digital converter is a first time-to-digital converter;
    the digital words are first digital words representing a positive portion of the signal input;
    the apparatus further comprising:
        a third comparator coupled to receive the signal input and a third input level;
        a fourth comparator coupled to receive the signal input and a fourth input level;
        a second time-to-digital converter coupled at a start port thereof to receive a third output from the third comparator and coupled at a stop port thereof to receive a fourth output from the fourth comparator;
        wherein the second time-to-digital converter is coupled to provide second digital words representing a negative portion of the signal input; and
        a data processing sub-system configured to store and process the first digital words and the second digital words for signal analysis.

8. The apparatus according to claim 7, further comprising:
    a fourth signal source coupled to receive a fourth digital input to provide the third input level to the third comparator; and
    a fifth signal source coupled to receive a fifth digital input to provide the fourth input level to the fourth comparator;
    wherein the third signal source is coupled to receive the third digital input to provide the signal input to the third comparator and the fourth comparator.

9. The apparatus according to claim 8, wherein:
    the fourth signal source and the fifth signal source are respective Sigma-Delta digital-to-analog converters.

10. The apparatus according to claim 2, wherein the first signal source, the second signal source, and the third signal source are respective differential digital-to-analog converters.

11. The apparatus according to claim 1, wherein the first comparator and the second comparator are respective differential comparators.

12. A method, comprising:
    receiving a signal input to each of a first comparator and a second comparator;
    coupling a first input level to the first comparator;
    coupling a second input level to the second comparator different from the first input level;
    wherein one of the first input level and the second input level is adjustable and another of the first input level and the second input level is fixed for sampling the signal input;
    wherein the first input level is a reference voltage level;
    wherein the second input level is a data voltage level;
    first transitioning a first output of the first comparator responsive to the signal input at least reaching the first input level;
    starting a time-to-digital converter in response to the first output associated with the first transitioning;
    second transitioning a second output of the second comparator responsive to the signal input at least reaching the second input level;
    stopping the time-to-digital converter in response to the second output associated with the second transitioning;
    outputting from the time-to-digital converter a digital word representing a time interval for the signal input;

wherein the time interval at least approximates a transition from the first input level to the second input level of the signal input.

13. The method according to claim 12, wherein the signal input surpasses each of the first input level and the second input level in a positive voltage direction.

14. The method according to claim 10, wherein the signal input surpasses each of the first input level and the second input level in a negative voltage direction.

15. The method according to claim 12, further comprising sweeping one of the first input level and the second input level.

16. The method according to claim 12, further comprising:
storing in memory a plurality of digital words including the digital word to represent the signal input as a digital waveform; and
performing a transform on the digital waveform for identification of a spur in the digital waveform.

17. A system, comprising:
a first comparator coupled to receive a signal input and a first input level;
a second comparator coupled to receive the signal input and a second input level different from the first input level;
wherein the signal input is obtainable from a device under test;
wherein one of the first input level and the second input level is adjustable and another of the first input level and the second input level is fixed for sampling the signal input;
wherein the first input level is a reference voltage level;
wherein the second input level is a data voltage level;
a time-to-digital converter coupled at a first port thereof to receive a first output from the first comparator and coupled at a second port thereof to receive a second output from the second comparator;
wherein the time-to-digital converter is coupled to provide digital words representing the signal input; and
a data processing sub-system configured to store and process the digital words for signal analysis.

18. The system according to claim 17, wherein the device under test is a digital-to-analog converter.

19. The system according to claim 17, wherein the signal input is a differential input.

* * * * *